United States Patent [19]
Aoyama

[11] Patent Number: 4,516,224
[45] Date of Patent: May 7, 1985

[54] SEMICONDUCTOR MEMORY
[75] Inventor: Keizo Aoyama, Yamato, Japan
[73] Assignee: Fujitsu Limited, Kawasaki, Japan
[21] Appl. No.: 402,427
[22] Filed: Jul. 28, 1982
[30] Foreign Application Priority Data
  Jul. 29, 1981 [JP]  Japan ................................ 56-118613
[51] Int. Cl.³ .............................................. G11C 11/40
[52] U.S. Cl. ..................................... 365/203; 365/189
[58] Field of Search ............... 365/203, 189, 230, 154
[56] References Cited
U.S. PATENT DOCUMENTS
  4,280,198  7/1981  Hueber et al. .................... 365/203
  4,404,662  9/1983  Masenas, Jr. ..................... 365/203
  4,443,868  4/1984  Takemae ........................... 365/203

*Primary Examiner*—Terrell W. Fears
*Attorney, Agent, or Firm*—Staas & Halsey

[57] ABSTRACT

A transistor for discharging a word line which is switched by a reset signal temporarily generated when the word line is switched from a selected state to a nonselected state and from the nonselected state to the selected state, the transistor being connected to the word line at an intermediate point on the word line, the word line being driven by a word driver. A relay buffer is connected to the word line at the intermediate point of the word line. The transistor for discharging the word line is connected to the input or output side of the relay buffer. The transistor for discharging the word line can be controlled by a control transistor which is in turn controlled by the output level of the relay buffer in dependence upon the reset signal.

13 Claims, 22 Drawing Figures

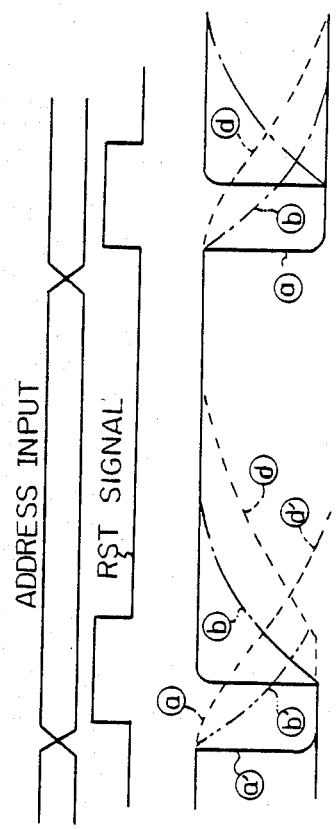
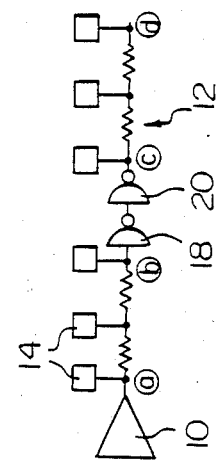
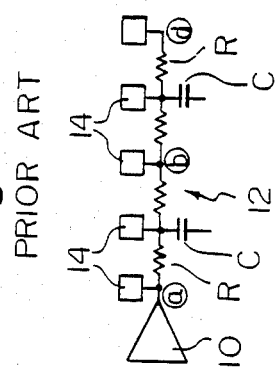

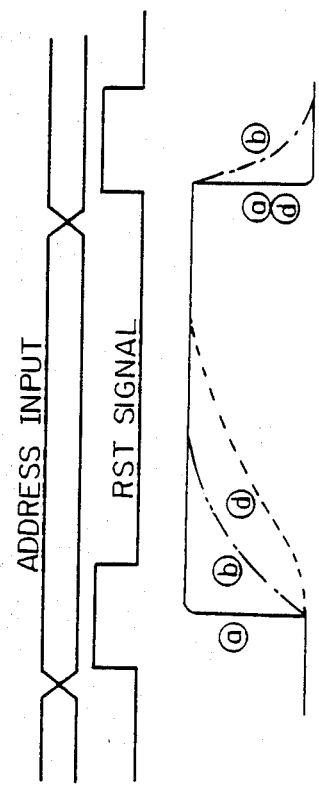
Fig. 4A
Fig. 4B
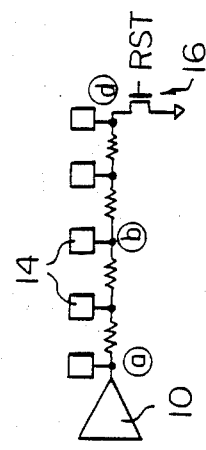
Fig. 5A
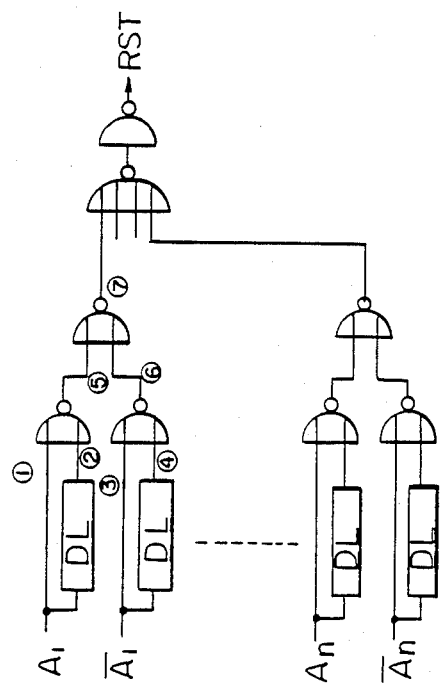
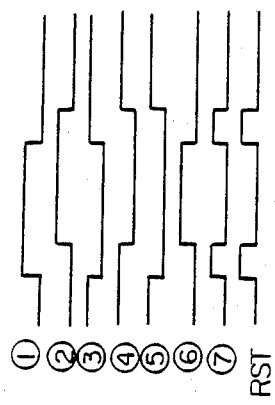
Fig. 5B

Fig. 9C
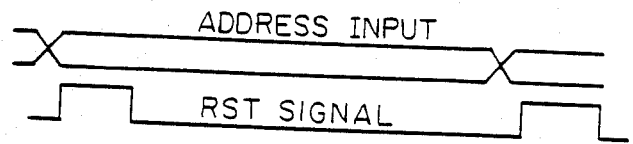
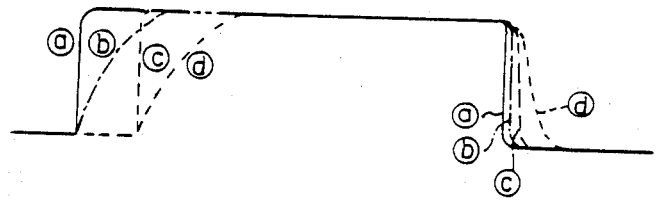
Fig. 9D
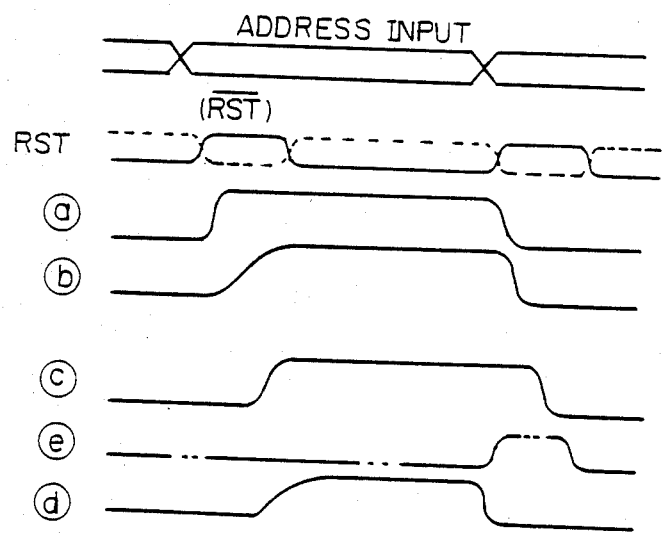

4,516,224

SEMICONDUCTOR MEMORY

BACKGROUND OF THE INVENTION

The present invention relates to a semiconductor memory. In particular, it relates to a circuit for driving the word lines of a semiconductor memory.

A semiconductor memory comprises a plurality of word lines and bit lines that are arrayed in vertical and lateral directions, with memory cells being arrayed at each of the intersecting points. In a static memory, memory cells are usually constructed in the form of a flip-flop circuit. In the metal-oxide semiconductor (MOS)-type memory cell, a pair of signal input/output terminals of the flip-flop circuit are connected to a pair of bit lines via transfer gates (MOS transistors), and the gate electrode wirings of the MOS transistors serve as word lines. The gate electrode wirings are usually formed from polycrystalline silicon, which has a relatively large resistance and creates a static capacitance relative to the substrate to establish a large time constant. If the word line has a large time constant as determined by the product of the resistance and the capacitance, the potential of a word line remote from the selected word driver cannot immediately respond to a change in the output of the selected word driver from a low level to a high level,—i.e., operation is delayed.

SUMMARY OF THE INVENTION

An object of the present invention is to provide a semiconductor memory in which the above-mentioned defects are eliminated and to provide a circuit for driving a semiconductor memory, in which circuit the output potential of a word line remote from the selected word driver can, without delay, respond to a change in the output level of the word driver during selection and nonselection of the word lines.

Another object of the present invention is to provide a circuit for a semiconductor memory in which the rising and falling characteristics of the voltage waveform in each portion of the word lines are improved when the word lines are selected or nonselected.

The above-mentioned objects can be achieved by a semiconductor memory comprising: a plurality of memory cells arranged in a row, a word line operatively connected to the plurality of the memory cells for selecting the memory cells, the word line being switched from a selected state to a nonselected state and from the nonselected state to the selected state, at least one transistor connected to the word line for discharging the word line, and a means for turning on the transistor for a predetermined period at least when the word line is switched from the selected state to the nonselected state.

Further features and advantages of the present invention will be apparent from the ensuing description with reference to the accompanying drawings which, however, in no way limit the scope of the invention.

BRIEF DESCRIPTION OF THE DRAWINGS

FIGS. 2A and 3A are circuit diagrams of conventional circuits for driving word lines;

FIGS. 2B and 3B are graphs of the rising and falling portions of the waveform in the circuit of FIGS. 2A and 3A;

FIG. 4A is a circuit diagram of one embodiment of the circuit for driving word lines according to the present invention;

FIG. 4B is a graph of the rising and falling portions of the waveforms in the circuit of FIG. 4A;

FIG. 5A is a circuit diagram of a circuit which forms a reset signal for the circuit of FIG. 4A;

FIG. 5B is a timing chart of the operation of the circuit of FIG. 5A;

FIG. 9C is a graph of the rising and falling portions of the waveform in the sixth embodiment;

FIG. 9D is a timing chart of the operation of the circuit of FIG. 9B;

DESCRIPTION OF THE PREFERRED EMBODIMENTS

Figures 1A, 1B:
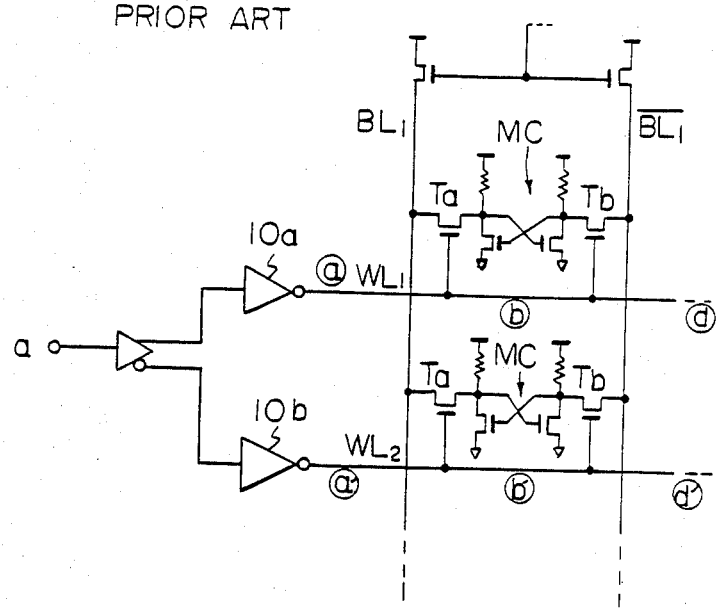
FIG. 1A is a circuit diagram of one example of a prior art circuit for driving the word lines of a semiconductor memory.
FIG. 1B illustrates waveforms in the essential portions of the circuit of FIG. 1A.

FIG. 1A is a circuit diagram of word lines $WL_1$, $WL_2, \ldots$, bit lines $BL_1, \overline{BL}_1, \ldots$, and memory cells MC arranged at cross points of the word lines and the bit lines. In static memory cells, memory cells MC are usually formed as a flip-flop circuit shown in FIG. 1A. A pair of signal input terminals of the flip-flop circuit are connected via transfer gates $T_a$ and $T_b$ (MOS transistors) to a pair of bit lines $BL_1$, $\overline{BL}_1$, and wirings connected to gates of MOS transistora $T_a$ and $T_b$ are used as word lines $WL_1$, $WL_2, \ldots$ FIG. 1B is a graph of output waveforms of word drivers 10a and 10b. A word line is at a high voltage level when it is selected.

In FIG. 1A, word lines $WL_1$, $WL_2, \ldots$ are usually made of polysilicon. Polysilicon word lines have a relatively large resistance so that static capacitance exists with respect to the substrate. Therefore, when the capacity of the memory increases and the length of the word lines increases, a large time constant exists in each word line.

In FIG. 2A, a delay in operation is illustrated. In the figure, 10 denotes a word driver, 12 denotes a word line, 14 denotes a plurality of memory cells, R denotes the resistance of the word line, and C denotes the stray capacitance. When the word line has a large time constant and if word driver 10 is selected and the output of word driver 10 is changed from a low level to a high level, a change in the portion of the word line which is remote from the word driver cannot immediately respond to the output of word driver 10, as shown in FIG. 2B. In FIG. 2B, ⓐ denotes a change in the output potential of word driver 10, ⓑ and ⓓ, respectively, denote a change in the potential in portions ⓑ and ⓓ in FIG. 2A, and ⓐ', ⓑ', and ⓓ', respectively, denote a change in the potential of the same portions of another word line previously selected. As shown in FIG. 2B, the rising and falling of the potential of the word line at intermediate points ⓑ and ⓑ' are slow and become slower in the end portions ⓓ and ⓓ'. When the timing of the variation of the potential in the word line is varied as shown in FIG. 2B, much time is required for reading or writing data so that a high-speed operation cannot be carried out. Further, a phenomenon such as mis-selection or multiselection may occur.

For the purpose of eliminating the above-mentioned disadvantage and of speeding up the rising portion of the word lines, a relay buffer is provided at an intermediate portion of the word lines, as shown in FIG. 3A. In FIG. 3A, two inverters 18 and 20 connected in series serve as relay buffers and are connected to word line 12. In this case, potentioal changes at points ⓐ, ⓑ, ⓒ, and ⓓ of the word line 12 are as represented in FIG. 3B. That is, the rise in potential at point ⓑ is more gradually than at point ⓐ, which is the output terminal of the word driver. At point ⓒ, however, the potential rises sharply due to the shaping function of the two stages of the inverters, and the potential rise is more gradual at point ⓓ. However, in the circuit shown in FIG. 3B, the rising point is delayed due to the shaping action of inverters 18 and 20 so that the falling point also is delayed. Accordingly, the circuit shown in FIG. 3A is also unfavorable.

FIG. 4A is a circuit diagram of one embodiment of the present invention in which the falling portion of the electric potential of the word line is improved by providing discharging transistor 16 at the end of the word line. That is, reset signal RST is generated when the electric potential of the word line falls, i.e., when the word line is switched from the selected state to the nonselected state. Here, reset signal RST is applied to transistor 16 to temporarily turn on the transistor so that the word line is discharged and the electric potential is rapidly decreased. The change in potential at each of the portions of the word line is shown in FIG. 4B, in which chain line ⓑ represents the potential at intermediate point ⓑ and dotted line ⓓ represents the potential at end portion ⓓ. It can be seen that the potential falls steeply at the end portion ⓓ and also falls quickly at intermediate point ⓑ as compared to when there is no transistor 16. The rising of the potential is not improved.

FIG. 5A is a circuit which generates the reset signal RST applied to transistor 16 in FIG. 4A, and FIG. 5B is a time chart of the waveform in the essential portions of the circuit shown in FIG. 5A. In the reset signal generating circuit shown in FIG. 5A, address signals $A_1 \sim A_n$ and inverted address signals $\overline{A}_1 \sim \overline{A}_n$ are supplied to input terminals thereof, and a pulse having a constant width is generated when the address input is changed. The width of reset pulse RST is determined by the delay time of delay circuit DL.

Figures 6A, 6B, 7A, 7B:
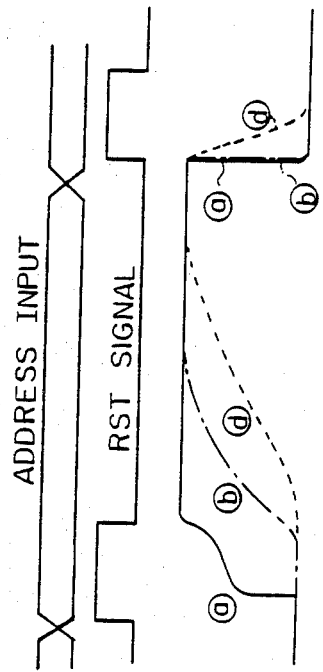
FIG. 6A is a circuit diagram of a second embodiment of the circuit for driving word lines according to the present invention.
FIG. 6B is a graph of the rising and falling portions of the waveforms in the circuit.
FIGS. 7A, 8A, and 8B are circuit diagrams of third, fourth and fifth embodiments of a circuit for driving word lines according to the present invention.
FIG. 7B is a graph of the rising and falling portions of the waveform in the circuit of FIG. 7A.

FIG. 6A is another embodiment of the present invention for further improving the falling characteristic of the embodiment shown in FIG. 5A. As can be seen by comparing the embodiment of FIG. 6A with the circuit shown in FIG. 4A. In the embodiment shown in FIG. 6A, discharging transistor 16 is connected to the word line 12 at an intermediate point thereof. In the circuit in FIG. 6A, the falling characteristic of the electric potential at the intermediate point becomes sharp so that the falling characteristic of the electric potential at the end point becomes sharp. Therefore, the variation of the characteristic at points ⓐ, ⓑ, and ⓓ of the word line when the electric potential on the word line is high can be lessened.

However, in the circuit shown in FIG. 6A, the rising characteristic of the electric voltage level cannot be improved and an abnormal phenomenon occurs therein. The reason for this is that if reset signal RST is still at a high voltage level at the time when the rising of point ⓐ of the word line is transmitted to point ⓑ, the electric voltage at point ⓑ cannot rise up and a current flows from word driver 10 to RST transistor 16. Therefore, it is necessary to determine the pulse timing of the RST signal within a range in which no such phenomenon occurs.

Figure 8B:
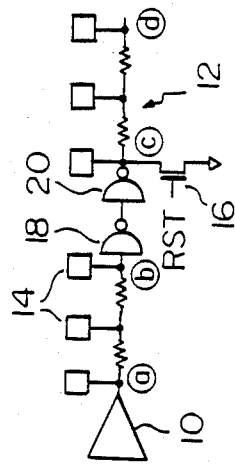
Figure 8A:
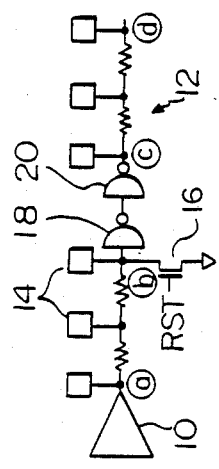

The circuits shown in FIG. 7A, FIG. 8A, and FIG. 8B can be obtained by combining the discharge transistor 16 and the relay buffers 18 and 20. In FIG. 7A, transistor 16 is provided at the end of the word line; in FIG. 8A, transistor 16 is provided at the input of the relay buffers 18 and 20; and in FIG. 8B, transistor 16 is provided at the output of the relay buffers 18 and 20. In the circuit shown in FIG. 8A, as in the case of FIG. 6A, it is necessary to determine the pulse timing of the RST signal so that transistor 16 is not switched to the on state by reset signal RST when the output of the word driver 10 rises. In the circuit shown in FIG. 7A, the rising characteristic of the electric voltage on the word line can be improved as shown in FIG. 7B. However, an abnormal phenomenon may occur in regard to the falling characteristic of the electric voltage at point ⓒ since the RST signal is at a high level at the same time that the voltage of point ⓒ is still at a high level as a result of the delay, due to the RC time constant of the word line and the response of inverters 18 and 20, so that the current flows from inverter 20 to RST transistor 16. In the circuit shown in FIG. 8B, as in the case of FIG. 7A, the rising characteristic of the electric voltage of the word line can be improved. However, an abnormal phenomenon may occur in regard to the falling characteristic of the electric voltage at point ⓒ, for the same reason as in the case of FIG. 7A.

Figure 9B:
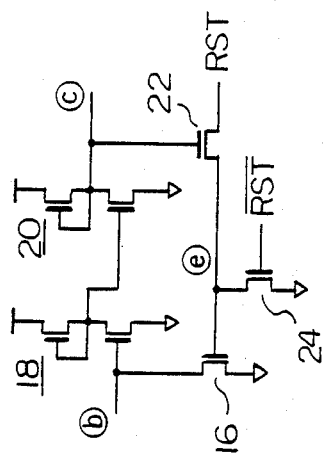
FIG. 9B is a detailed circuit diagram of the block diagram of FIG. 9A.
Figure 9A:
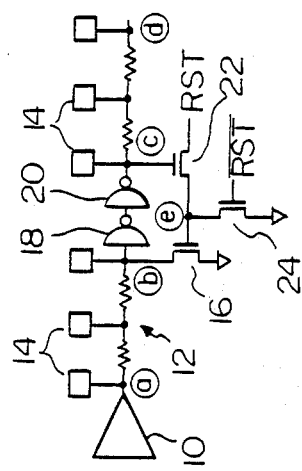
FIG. 9A is a block diagram of the sixth embodiment of the present invention.

Such a drawback can be eliminated by the embodiment, for example, shown in FIG. 9A. In FIG. 9A, as will be obvious when FIG. 9A is compared with FIG. 7A, FIG. 8A, and FIG. 8B, the transistor 16 for discharging word line 12 is connected to the input side of the relay buffers 18 and 20, and reset signal RST is supplied to the gate of transistor 16 via transistor 22, which is turned on or off by the potential on the output side of the relay buffers. Further, the gate of transistor 16 is connected to a low-potential point (ground) via transistor 24, which is turned on or off by the inverted signal $\overline{RST}$ of reset signal RST. FIG. 9B illustrates a circuit of a relay buffer portion of FIG. 9A. Inverters 18 and 20 comprise, for example, a depletion-type load MOS transistor, of which the gate and source are short-circuited, and an enhancement-type drive transistor, the transistors being connected in series. Relay buffers which consume less electric power can be obtained if inverters 18 and 20 comprise complementary MOS circuits. Transistors 16, 22, and 24 operate in the same manner as those of FIG. 9A.

Therefore, the potential at each of the portions of the word line is as denoted in FIG. 9C. That is, at the moment when the potential at point ⓑ begins to rise in accordance with the word line being selected, the potential at point ⓒ may not yet have been begun to rise. Therefore, transistor 16 is not yet rendered conductive and interrupts the rise in potential at point ⓑ, i.e., the discharge current is not allowed to flow and the waveform is not distorted. When the potential rises at point ⓒ, reset signal RST falls and inverted signal $\overline{\text{RST}}$ rises. Accordingly, the gate of transistor 16 is connected to ground, that is, transistor 16 is not rendered conductive. When the word line is switched from the nonselected state to the selected state, the device operates in the same manner as when there is no discharging transistor.

Figure 10A:
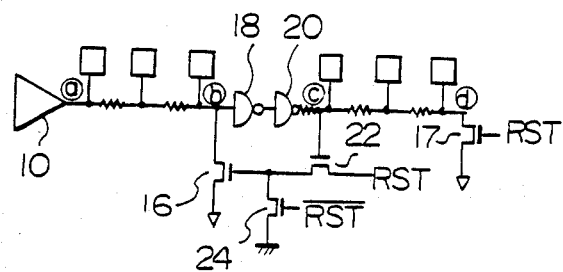
FIG. 10A is a block diagram of a seventh embodiment of the present invention.
Figure 10B:
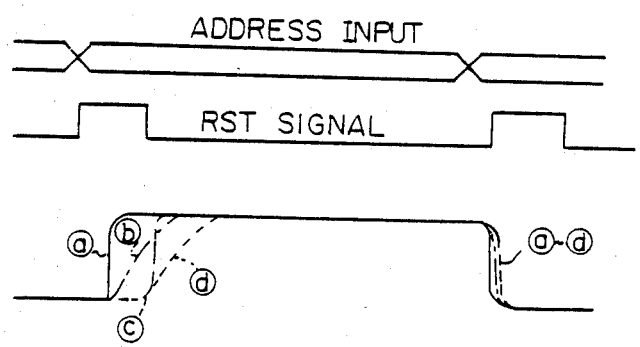
FIG. 10B is a graph for describing the operation of the block diagram of FIG. 10A.

When the word line is switched from the selected state to the nonselected state, the potential at point ⓒ still remains at a high level even after reset signal RST has risen. Transistor 22, therefore, is rendered conductive, and reset signal RST is supplied to the gate of transistor 16 to render it conductive. Consequently, the potential at point ⓑ falls quickly, as shown in FIG. 9C. The potential at points ⓒ and ⓓ fall quickly. However, the potential at point ⓒ falls after being delayed for the time required for inverters 18 and 20 to invert, and the potential at point ⓓ falls after being further delayed by the time constant established between point ⓒ and point ⓓ. Delay of the falling time at point ⓓ due to the time constant between points c and ⓓ can be improved by adding RST transistor 17 (FIG. 10A) at point ⓓ to the embodiment shown in FIG. 9A. The embodiment is shown in FIG. 10A, and the waveforms of the embodiment in FIG. 10A are shown in FIG. 10B. In the embodiments shown in FIGS. 10A and 10B, the falling characteristic of the voltage at points ⓐ, ⓑ, ⓒ, and ⓓ is not affected by the delay due to the time constant RC at each point, and a rapid falling characteristic can be obtained as shown in FIG. 10B.

FIG. 9D illustrates a timing chart which shows the relative relationship among reset signal RST, reversed reset signal $\overline{\text{RST}}$, and the electric potentials at the points ⓐ, ⓑ, ⓒ, and ⓓ, and at the gate of transistor 16.

Reset signal RST is generated when the row address signal is switched. With regard to one word line, therefore, the reset signal RST is generated when the word line is switched from the selected state to the nonselected state and when the word line is switched from the nonselected state to the selected state. Further, the reset signal must have a predetermined width so that the word line can be sufficiently discharged. In addition, in the above-mentioned embodiment, one or two transistors for discharging the word line are used, however, it should be understood that more than two transistors may be connected when the word line is longer.

According to the present invention as described above, the potential rise and fall of the word lines can be improved. The invention exhibits these effects when adapted to large-capacity memories. In addition to MOS static memories, the invention can be suitably adapted to bipolar (I²L) integrated injection logic memories in which the word lines have a high resistance.

I claim:

1. A semiconductor memory, comprising:
a plurality of memory cells arranged in a row;
a word line, operatively connected to said plurality of memory cells, for selecting said memory cells, said word line being switched from a selected state to a non-selected state and from the non-selected state to the selected state;
at least one transistor, operatively connected to said word line, for discharging said word line, said at least one transistor having a gate; and
means, operatively connected to said at least one transistor for generating a pulse having a predetermined width by detecting when said word line is switched from the selected state to the non-selected state and for turning on said at least one transistor for a predetermined period of time, thereby accelerating the discharge of the word line from the selected state to the non-selected state.

2. A semiconductor memory according to claim 1, wherein said at least one transistor is connected to a point substantially in the middle of said word line.

3. A semiconductor memory according to claim 1, further comprising at least one relay buffer operatively connected to said word line, said at least one relay buffer having an input terminal and an output terminal, each said terminal operatively connected to said word line.

4. A semiconductor memory according to claim 3, wherein said at least one relay buffer is operatively connected to a point substantially in the middle of said word line, and wherein said at least one transistor is operatively connected to said input terminal of said at least one relay buffer.

5. A semiconductor memory according to claim 4, wherein said means for turning on said at least one transistor comprises:
a first control transistor having a gate operatively connected to said output terminal of said at least one relay buffer and said gate of said at least one transistor;
a second control transistor operatively connected between said gate of said at least one transistor and a ground potential point, said second control transistor having a gate; and
means, operatively connected to said at least one relay buffer, said first control transistor and said second control transistor, for generating a reset signal and a reversed reset signal for the predetermined period when said word line is switched from the selected state to the non-selected state, wherein said gate of said at least one transistor is operatively connected to receive the reset signal, and wherein said gate of said second control transistor is operatively connected to receive the reversed reset signal.

6. A semiconductor memory according to claim 5, further comprising a third control transistor, operatively connected to an end of said word line and to the reset signal generating means, for discharging said word line, said third control transistor being controlled by the reset signal.

7. A semiconductor memory, comprising:
memory cells arranged in a row;
a word line having a selected state and a non-selected state, operatively connected to said memory cells, for selecting said memory cells in accordance with said selected or non-selected state;
a transistor, operatively connected to said word line, for discharging said word line;
means, operatively connected to said transistor, for generating a pulse having a predetermined width by detecting when said word line is switched from said selected state to said non-selected state and for turning on said transistor for a predetermined period of time, thereby accelerating the discharging of the word line from the selected state to the non-selected state.

8. A semiconductor memory, according to claim 7, wherein said transistor is connected to a point substantially in the middle of said word line.

9. A semiconductor memory, according to claim 7, further comprising a relay buffer operatively connected to said word line, having an input and output terminal operatively connected to said word line.

10. A semiconductor memory according to claim 9, wherein said relay buffer is operatively connected to a point substantially in the middle of said word line, and wherein said transistor is operatively connected to said input terminal of said relay buffer.

11. A semiconductor memory according to claim 10, wherein said transistor has a gate and wherein said means for turning on said transistor comprises:
   a first control transistor having a gate operatively connected to said output terminal of said relay buffer and said gate of said transistor;
   a second control transistor having a gate, operatively connected between said gate of said transistor and a ground potential point; and
   means, operatively connected to said relay buffer, said first control transistor, and said second control transistor, for generating a reset signal and a reversed reset signal for the predetermined period when said state of said word line is switched from said selected state to said non-selected state, wherein said gate of said transistor is operatively connected to receive the reset signal, and wherein said gate of said second control transistor is operatively connected to receive the reversed reset signal.

12. A semiconductor memory according to claim 11, further comprising a third control transistor, operatively connected to an end of said word line and to said reset signal generating means, for discharging said word lines in dependence upon the reset signal.

13. A semiconductor memory, operatively connected to receive address input signals, according to claim 1, wherein said generating means generates said pulse by detecting a transition in the address input signals.

* * * * *